United States Patent [19]
Yokoi et al.

[11] Patent Number: 4,866,003
[45] Date of Patent: Sep. 12, 1989

[54] PLASMA VAPOR DEPOSITION OF AN IMPROVED PASSIVATION FILM USING ELECTRON CYCLOTRON RESONANCE

[75] Inventors: Katsuyuki Yokoi; Shigeru Suga; Toshio Fujioka, all of Shizuoka, Japan

[73] Assignee: Yamaha Corporation, Hammamatsu, Japan

[21] Appl. No.: 123,566

[22] Filed: Nov. 20, 1987

[30] Foreign Application Priority Data

Nov. 22, 1986 [JP] Japan .................. 61-279378

[51] Int. Cl.$^4$ .......................................... H01L 27/02
[52] U.S. Cl. ........................... 437/040; 427/39; 437/171; 437/173; 437/241; 148/DIG. 114
[58] Field of Search ............... 437/040, 228, 173, 018; 118/723, 50.1; 427/047; 156/643

[56] References Cited

U.S. PATENT DOCUMENTS

| | | | |
|---|---|---|---|
| 4,401,054 | 8/1983 | Matsuo et al. | 118/723 |
| 4,481,229 | 11/1984 | Suzuki et al. | 427/38 |
| 4,543,266 | 9/1985 | Matsuo et al. | 427/38 |
| 4,543,592 | 9/1985 | Itsumi et al. | 357/43 |
| 4,564,997 | 1/1986 | Matsuo et al. | 437/187 |
| 4,566,940 | 1/1986 | Itsumi et al. | 156/643 |
| 4,599,137 | 7/1986 | Akiya | 156/643 |

FOREIGN PATENT DOCUMENTS 60-107841  6/1985  Japan .

OTHER PUBLICATIONS

Fujita et al., "Silicon Nitride Films by Plasma-CVD From SiH$_4$-N$_2$-H$_2$ Gas Mixtures", *IEDM*, pp. 630-633 (1984).

Fujita et al., "Trap Generation in Gate Oxide Layer of MOS Structures Encapsulated by Silicon Nitride", *IEDM*, pp. 64-67 (1985).

*Primary Examiner*—Brian E. Hearn
*Assistant Examiner*—Beverly A. Pawlikowski
*Attorney, Agent, or Firm*—Burns, Doane, Swecker & Mathis

[57] ABSTRACT

For enhancement of device stability, there is disclosed a semiconductor device fabricated on a semiconductor substrate comprising (a) source and drain regions formed in a surface portion of the semiconductor substrate and spaced from each other by a channel region, (b) a gate insulating film formed on the channel region, (c) a gate electrode structure formed on the gate insulating film, and (d) a passivation film of an insulating material covering the gate electrode structure and containing hydrogen-bonded-silicons equal in number to or less than $5 \times 10^{21}$ per cm$^3$, and the unstable hydrogen-bonded-silicons are decreased in number so that the semiconductor device only have a decreased trap density which results in stable operation.

3 Claims, 9 Drawing Sheets

PLASMA VAPOR DEPOSITION OF AN IMPROVED PASSIVATION FILM USING ELECTRON CYCLOTRON RESONANCE

FIELD OF THE INVENTION

This invention relates to a semiconductor device and, more particularly, to a passivation film with an improved hot-carrier resistivity.

BACKGROUND OF THE INVENTION

A typical semiconductor device such as, for example, a MOS type field effect transistor fabricated on a semiconductor substrate is provided with a passivation film to protect the active areas thereof from impurities, moisture and scratches. The passivation film is typically formed of phosphorus-doped silicon dioxide or phosphosilicate glass because the phosphorus-doped silicon dioxide inhibits diffusions of sodium impurities and because it softens and flows at a temperature ranging between 1000 degrees and 1100 degrees in centigrade for creating a smooth topography. However, in another implementation is frequently used a passivation film formed of silicon nitride which is chemically deposited by a plasma-assisted chemical vapor deposition technique at a high frequency, because of its excellent scratch protection. Then, the silicon nitride passivation film is widely used in MOS type field effect transistors.

However, a problem has been encountered in the prior-art MOS type field effect transistor with the silicon nitride passivation film formed by the high-frequency plasma-assisted chemical vapor deposition in deterioration in device characteristics due to hot carriers injected into the gate oxide film from the drain-substrate junction where a strong electric field tends to be applied. Namely, when a passivation film of silicon nitride is formed by the high-frequency plasma-assisted chemical vapor deposition, the resultant passivation film contains a large amount of hydrogen which sometimes ranges between 20 and 30% by atom, because the silicon nitride is formed by reacting silane and ammonia which is assumed to be $$3SiH_4 + 4NH_3 \rightarrow Si_3N_4 + 12H_2 \quad \text{(Eq. 1)}$$

The hydrogen adsorbed in the passivation film is diffused into the gate oxide film and, then, reacts to the hot carriers injected thereto for formation of surface states and fixed charges. This results in deterioration in device characteristics such as, for example, the threshold voltage of the MOS type field effect transistor.

Attempts have been made to reduce the amount of hydrogen adsorbed in the passivation film. One of the attempts is to form the passivation film in a high temperature ambient or to apply heat to the passivation film after formation. However, the maximum temperature is restricted below 450 degrees in centigrade because of heat attack to aluminum wiring layers incorporated in the MOS type field effect transistor. Then, the adsorbed hydrogen is slightly reduced but remains on the order of 15% by atom. Other approaches are to use a reaction of silane and nitrogen and a reaction of silicon tetrachloride or silicon tetrafluoride and nitrogen. The silicon nitride film deposited by reacting silane and nitrogen still contains hydrogen of about 15% by atom, and, on the other hand, the silicon nitride film deposited by reacting silicon tetrachloride or silicon tetrafluoride and nitrogen contains a extremely small amount of hydrogen but contains a substantial amount of chlorine or fluorine which tends to corrode metal wiring layers of the MOS type field effect transistor. As a consequence, those attempts could not provide a sufficient solution of the problem inherent in the prior-art MOS type field effect transistor.

SUMMARY OF THE INVENTION

It is therefore an important object of the present invention to provide a semiconductor device which is free from the deterioration in device characteristics due to injected hot carriers.

It is another important object of the present invention to provide a semiconductor device which has a passivation film of silicon nitride containing sufficiently reduced hydrogen.

It is also important object of the present invention to provide a process of fabricating a semiconductor device with a passivation film containing sufficiently reduced hydrogen.

To accomplish these objects, the present invention proposes to reduce hydrogen-bonded-silicons contained in the passivation film to $5 \times 10^{21}$ per $cm^3$ or less.

In accordance with one aspect of the present invention, there is provided a semiconductor device fabricated on a semiconductor substrate comprising (a) source and drain regions formed in a surface portion of the semiconductor substrate and spaced from each other by a channel region, (b) a gate insulating film formed on the channel region, (c) a gate electrode structure formed on the gate insulating film, and (d) a passivation film of an insulating material covering the gate electrode structure and containing hydrogen-bonded-silicons equal in number to or less than $5 \times 10^{21}$ per $cm^3$.

In accordance with another aspect of the present invention, there is provided a process of fabricating a semiconductor device comprising the steps of (a) preparing a multi-layer structure having source and drain regions formed in respective portions of a semiconductor substrate, a gate insulating film formed over that area between the source and drain regions and a gate electrode structure formed on the gate insulating film, and (b) forming a passivation film covering the multi-layer structure by a plasma-assisted chemical vapor deposition technique using a plasma associated with an electron cyclotron resonance. The plasma-assisted chemical vapor deposition may be carried out by using a gaseous mixture of silane and nitrogen at a pressure of about $8 \times 10^{-3}$ Torr.

BRIEF DESCRIPTION OF THE DRAWINGS

The features and advantages of a semiconductor device and a process of fabrication thereof according to the present invention will be more clearly understood from the following description taken in conjunction with the accompanying drawings in which:

FIGS. 3 (A) to (M) are cross sectional views showing a series of steps for fabricating the semiconductor device illustrated in FIG. 1;

DESCRIPTION OF THE PREFERRED EMBODIMENTS

Figure 1:
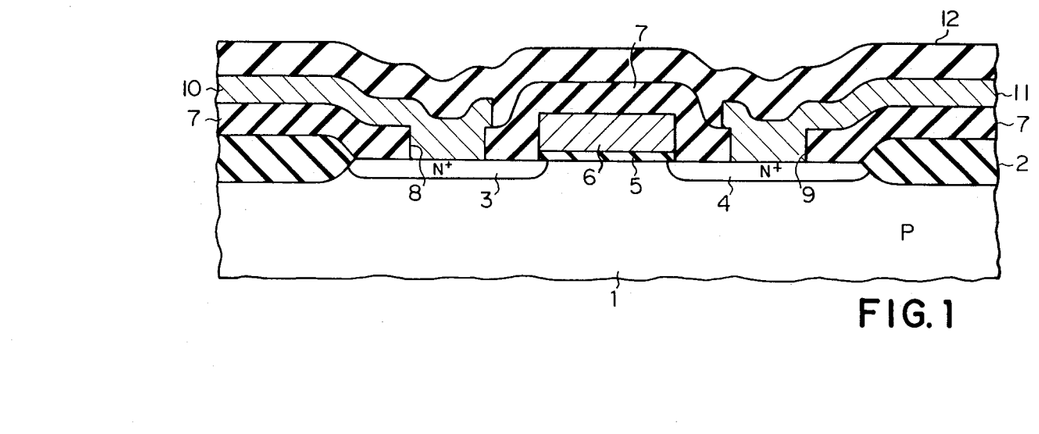
FIG. 1 is cross sectional view showing the structure of a semiconductor device embodying the present invention.

Referring to FIG. 1 of the drawings, there is shown the structure of a MOS type field effect transistor embodying the present invention. The MOS type field effect transistor is fabricated on a p-type lightly doped <100>-oriented, polished silicon substrate covered with a thick field insulating layer 2 except for an active device area where an n+ source region 3 and an n+ drain region 4 are formed. The field insulating layer 2 is of silicon dioxide and has a thickness between 5000 angstroms and 10000 angstroms. On an area between the source region 3 and the drain region 4 is formed a thin gate insulating film 5 of silicon dioxide which has a thickness of about 400 angstroms. A gate electrode 6 of n-type heavily doped polysilicon overlies the gate insulating film 5. In this instance, the gate electrode 6 is formed of n-type heavily doped polysilicon however refractory metals or polysides are available for smaller device. The gate electrode 6 is covered with an intermediate insulating layer 7 of phosphorus-doped silicon dioxide or phosphosilicate glass which extends over the source region 3 and the drain region 4. The intermediate insulating layer 7 is formed with contact windows 8 and 9 which are open at the surfaces of the source region 3 and the drain region 4, respectively and source and drain electrodes 10 and 11 of aluminum or aluminum-silicon alloy are connected to the source and drain regions 3 and 4 through the contact windows 8 and 9, respectively. The entire surface is covered with a passivation layer 12 of silicon nitride which contains hydrogen-bonded-silicons equal in number to or less than $5 \times 10^{21}$ per $cm^3$. In this instance, the passivation layer 12 has a thickness of about 5000 angstroms.

Figure 2:
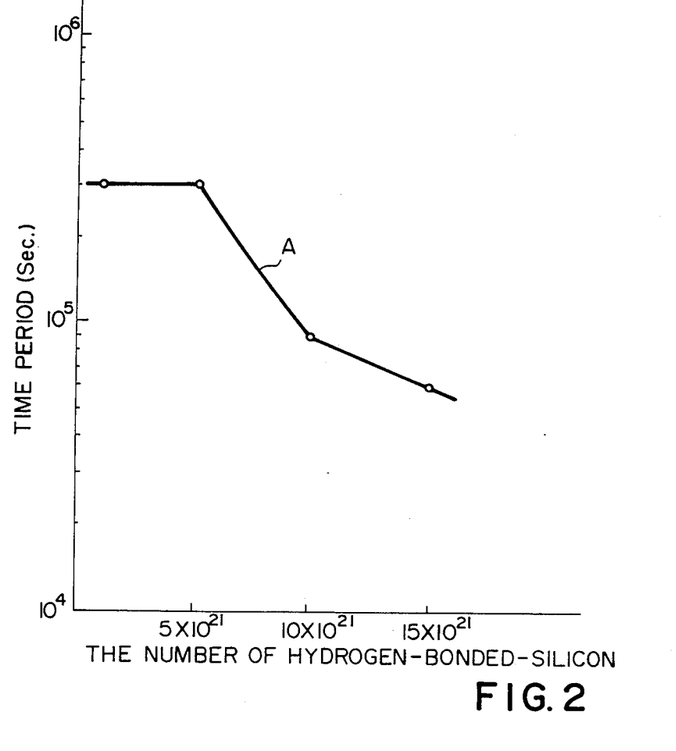
FIG. 2 is a graph showing the relationship between the number of hydrogen-bonded-silicons and deterioration in device characteristics.

The MOS type field effect transistor illustrated in FIG. 1 has the passivation layer 12 with reduced hydrogen-bonded-silicons and, for this reason, is free from deterioration in device characteristics. This advantage of the passivation layer 12 is described hereinunder in detail with reference to FIG. 2 of the drawings. FIG. 2 shows a deterioration of device characteristics due to the hydrogen-bonded-silicons contained in the passivation layer 12. In general, when hot-carriers are injected into the gate insulating film 5, the threshold voltage thereof is shifted in the direction to decrease the drain current flowing the channel thereof. Then, the deterioration of device characteristics is represented by a time period for decreasing the drain current to 90% of the initial amount thereof. As will be clearly seen from plots A in FIG. 2, the MOS type field effect transistor drastically deteriorates in device characteristics if the passivation layer 12 has the hydrogen-bonded-silicons greater in number than $5 \times 10^{21}$ per $cm^3$. The experiences are carried out with a MOS type field effect transistor having a channel width of 50 microns and a gate length of 1.4 micron. Moreover, a drain voltage of 7 volts is applied to the drain electrode and a gate voltage of 3.2 volt is applied to the gate electrode thereof. The results show that a MOS type field effect transistor can operate in stable condition for a sufficiently long period of time when the transistor has a passivation layer with reduced hydrogen-bonded-silicons such as the passivation layer 12. Then, the MOS type field effect transistor illustrated in FIG. 1 is advantageous over the prior-art semiconductor devices in prolonged stable operation.

Turning to FIGS. 3 (A) to (K), there is shown a process of fabricating the MOS type field effect transistor illustrated in FIG. 1. The starting material is a p-type lightly doped typically less than $10^{15}$ $cm^{-3}$), <100>-oriented, polished silicon wafer. The <100>-orientation is advantageous over <111>-orientation in that an interface trap density is about one tenth that of a <111>-oriented silicon wafer. The first step is formation of the field insulating layer 2. The silicon wafer serves as the substrate 1. A relatively thin silicon nitride layer 21 is deposited on the surface of the silicon wafer 1 to a thickness of about 1000 angstroms. A low-pressure chemical vapor deposition technique (LPCVD) is used to form the silicon nitride layer 21 and the resultant structure is illustrated in FIG. 3(A). The silicon nitride layer 21 is partially etched using a photoresist as a mask (not shown) to expose an area where the field insulating layer is formed ( FIG. 3(B)). The silicon substrate 1 partially covered with the silicon nitride layer 21 is then placed in a high-temperature oxidation ambient to form the field insulating layer 2. When the exposed silicon substrate 1 is thermally grown to a thickness between 5000 angstroms and 10000 angstroms as shown in FIG. 3 (C), the silicon nitride layer 21 is stripped off, exposing an active device area of the silicon substrate 1 where a MOS type field effect transistor is fabricated. The resultant structure is illustrated in FIG. 3 (D) of the drawings.

The subsequent step is to form the gate insulating film 5 and the gate electrode 6 overlying the gate insulating film 5. The structure illustrated in FIG. 3 (D) is placed in an high-temperature oxidation ambient to form a thin silicon dioxide film 22 on the exposed active device area to a thickness of about 400 angstroms as will be seen from FIG. 3 (E). Boron atoms are implanted through the thin silicon dioxide film 22 to adjust the threshold voltage. A deposition of polysilicon follows to form a polysilicon layer 23 and the resultant structure is illustrated in FIG. 3 (F). In this instance, the polysilicon layer 23 is deposited on the thin silicon dioxide film 22 by pyrolyzing silane at a temperature between 600 and 650 degrees in centigrade in a low-pressure reactor (not shown). The polysilicon layer 23 is doped by addition of an n-type dopant gas such as, for example, phosphine or arsine during deposition (in-situ doping). After the in-situ doping the polysilicon layer 23 is annealed to enhance the conductivity. When the doped polysilicon 23 is formed on the thin silicon dioxide film 22, the doped polysilicon layer 23 and, thereafter, the silicon dioxide film 22 are partially removed and patterned to form the gate electrode 6 (FIG. 3 (G)) and the gate insulating film 5 (FIG. 3(H)) by series steps of lithographic technique.

Figure 3A:
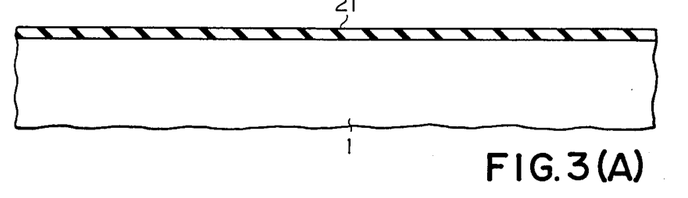
Figure 3B:
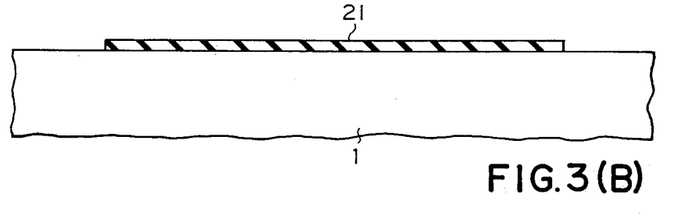
Figure 3C:
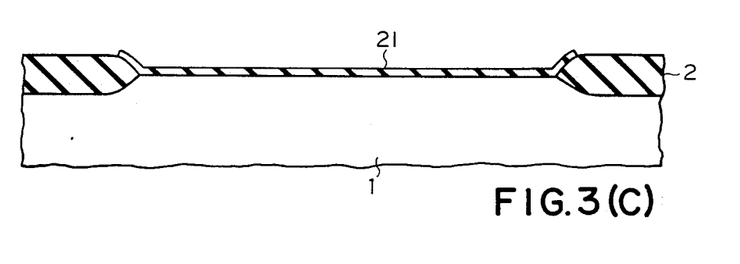
Figures 3D, 3E:
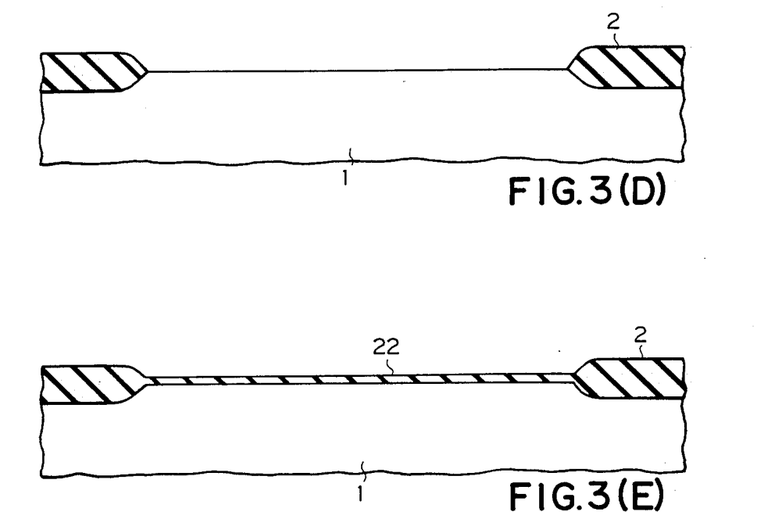
Figure 3F:
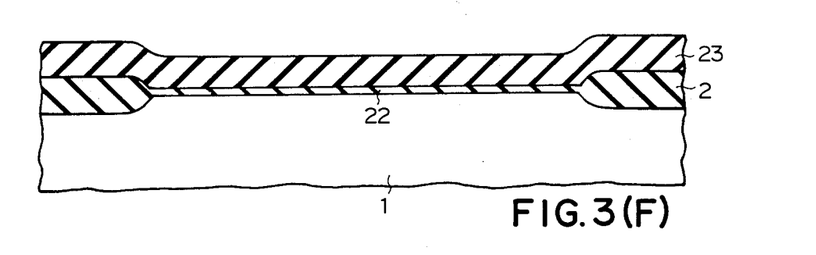
Figure 3G:
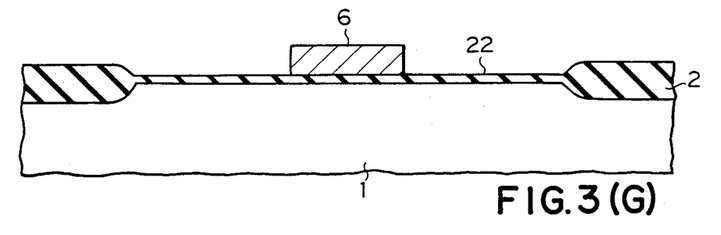
Figure 3H:
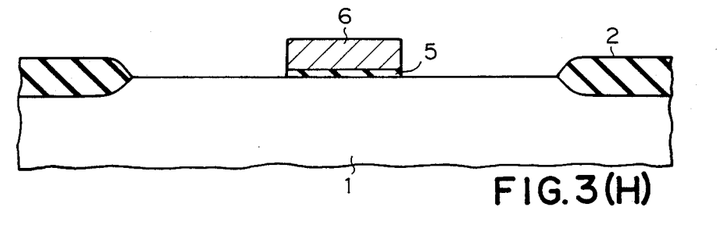
Figure 3I:
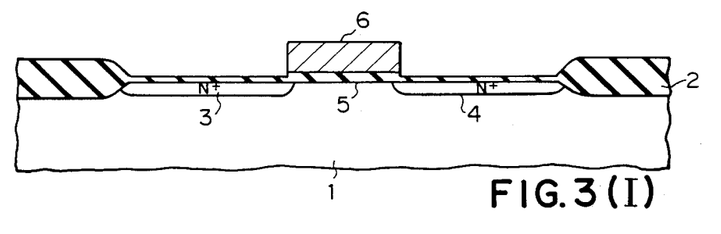
Figure 3J:
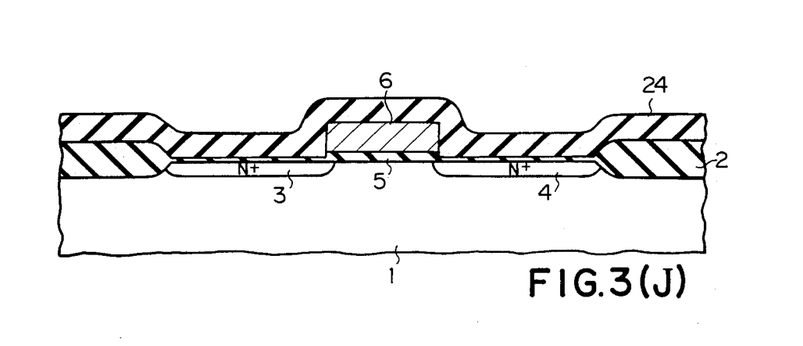
Figure 3K:
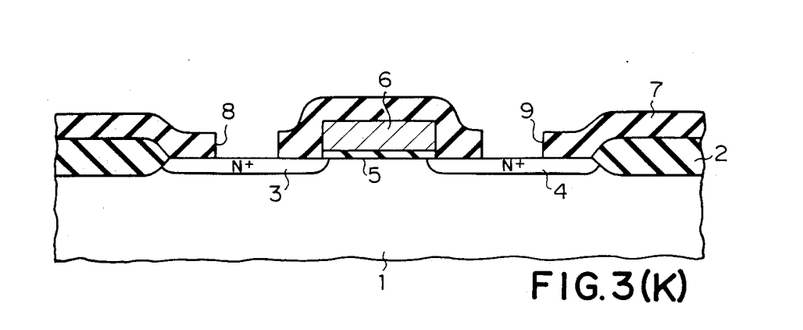

After formation of the gate electrode 6, the source and drain regions 3 and 4 are formed by ion implantation of phosphorus atoms or arsenic atoms, typically $10^{16} cm^{-2}$, using the gate electrode 6 as an implantation mask. The implantation energy may be about 30 ekV. When the implantation is completed, the silicon substrate 1 is annealed to activate the implanted impurities. The resultant structure is illustrated in FIG. 3 (I). During the annealing step, a thin silicon oxide film is grown on the surface of the source and drain regions 3 and 4 so that a thick phosphorus-doped silicon dioxide layer 24 or a phosphosilicate glass layer is deposited on the entire surface of the structure by a chemical vapor deposition technique (FIG. 3(J)). On the thick phosphorus-doped silicon dioxide layer 24 is applied a photosensitive material which is exposed to a light source and is, then, selectively removed by an etchant to form a photo-mask defining contact windows for the source and drain regions 3 and 4. With the photo-mask applied on the phosphorus-doped silicon dioxide layer 24, the phosphorus-doped silicon dioxide layer and the undesirable silicon dioxide film grown during the previous annealing step are partially removed to form the source contact window 8 and the drain contact window 9 by using an appropriate etchant. When the contact windows 8 and 9 are formed, the surfaces of the source and drain regions 3 and 4 are exposed and the intermediate insulating layer 7 remains on the gate electrode 6 and on the field insulating layer 7 as shown in FIG. 3 (K). In this instance, a part of intermediate insulating layer 7 covering the gate electrode 6 and the gate electrode 6 forms in combination the gate structure.

Figure 3L:
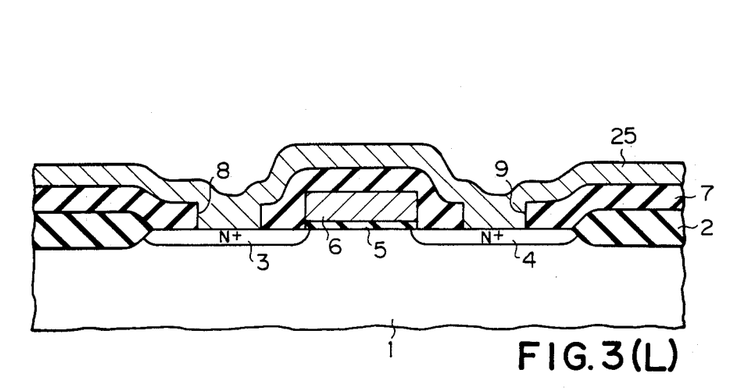
Figure 3M:
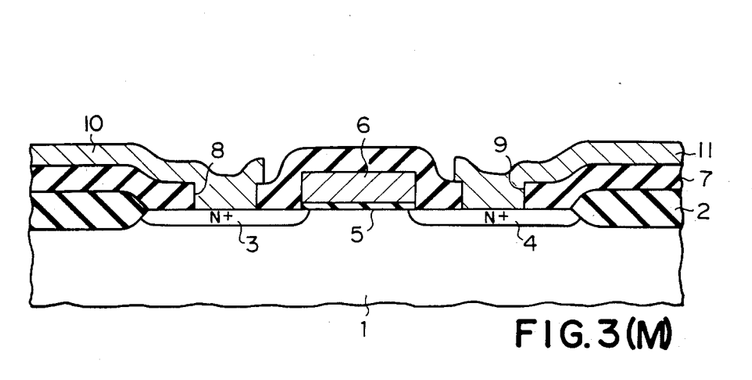

The subsequent step is to form the source electrode 10 and the drain electrode 11. After formation of the contact windows 8 and 9, aluminum is deposited on the entire surface of the resultant structure to form an aluminum layer 25. In the previous step, the contact windows 8 and 9 are formed to exposed the surfaces of the source and drain regions 3 and 4 so that the aluminum layer 25 penetrates the intermediate insulating layer 7 to reach the surfaces of the source and drain regions 3 and 4 as will be seen from FIG. 3 (L). Upon completion of the aluminum deposition, the aluminum layer 25 is partially removed to form the source electrode 10 and the drain electrode 11 by a lithographic technique. The resultant structure is illustrated in FIG. 3 (M).

The final step is to form the passivation layer 12 of silicon nitride covering the entire surface of the structure illustrated in FIG. 3 (M). The passivation layer 12 is formed by a plasma-assisted chemical vapor deposition using a plasma associated with an electron cyclotron resonance. In this technique, electrons in the plasma is accelerated to supply much energy for the reaction under an electron cyclotron resonance condition where the magnet field is 875 G with respect to the micro-wave at about 2.45 GHz. The passivation layer 12 is deposited by using a gaseous mixture of silane and nitrogen at a pressure less than $8 \times 10^{-3}$ Torr. The passivation layer 12 thus formed may have hydrides in the form of hydrogen-bonded-nitrogen-(N-H), however the hydrogen-bonded-nitrogens are stable in comparison with the hydrogen-bonded-silicon so that the hydrogen-bonded-nitrogens do not dissociate under the influence of the injection of hot-carriers. This means that even if the passivation layer 12 contains the substantial number of the hydrogen-bonded-nitrogens, the hydrogen-bonded-nitrogens do not serve the source of hydrogen and, for this reason, the the trap density is not increased. This results in stability of device characteristics such as threshold voltage. With the passivation layer 12 formed on the entire surface of the structure, the MOS type field effect transistor is completed on the silicon substrate 1 as illustrated in FIG. 1.

Figure 4:
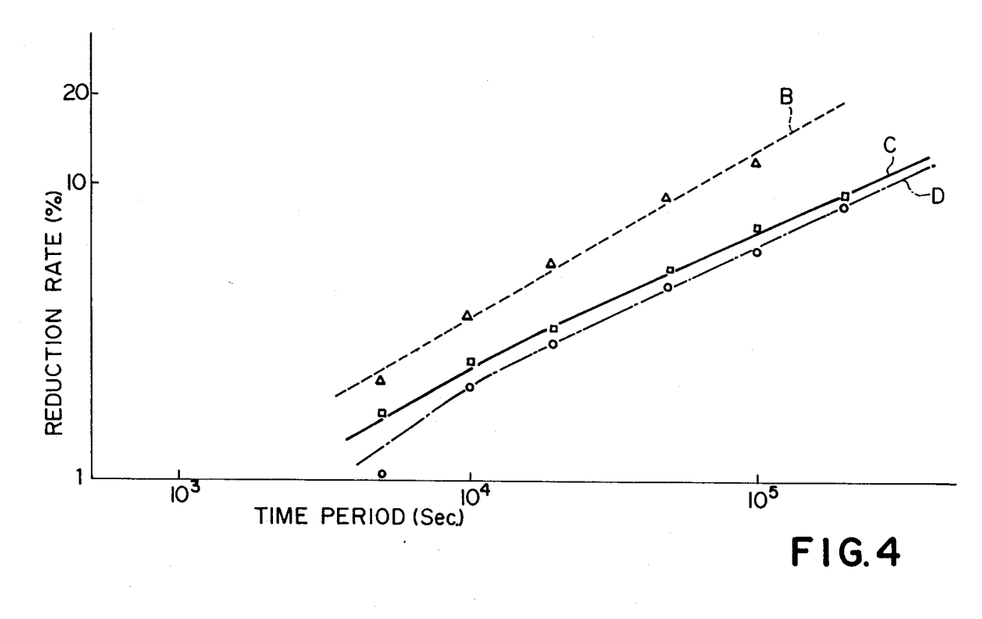
FIG. 4 is a graph showing the relationship between passivation films formed by different deposition techniques and deterioration in device characteristics.

The plasma-assisted chemical vapor deposition using the electron cyclotron resonance phenomenon is advantageous in formation of an improved passivation layer. FIG. 4 shows the influences of hot-carriers injected into respective passivation layers on device characteristics. As described hereinbefore, the influence of hot-carrier injection is actualized to be reduction in the amount of drain current flowing the channel thereof so that the axis of ordinates indicates reduction rates of the drain current. In FIG. 4, plots B stand for a passivation layer of silicon nitride formed by a high-frequency plasma-assisted chemical vapor deposition without assistance of the electron cyclotron resonance phenomenon, and, on the other hand, plots C stand for the passivation layer 12 formed by the plasma-assisted chemical vapor deposition with assistance of the electron cyclotron resonance phenomenon. For the sake of comparison, plots D is added to show an influence of a passivation layer of phosphorus-doped silicon dioxide formed by a normal chemical vapor deposition technique. Comparing plots C with plots B, although both of plots B and plots C increase in reduction rate with time, however plots B is more sensitive to the injected hot-carriers with respect to plots C. As a result, it will be understood that the plasma-assisted chemical vapor deposition associated with the electron cyclotron phenomenon is preferable to form an improved passivation layer which prevents the MOS type field effect transistor from the undesirable influence of injected hot-carriers.

Figure 5:
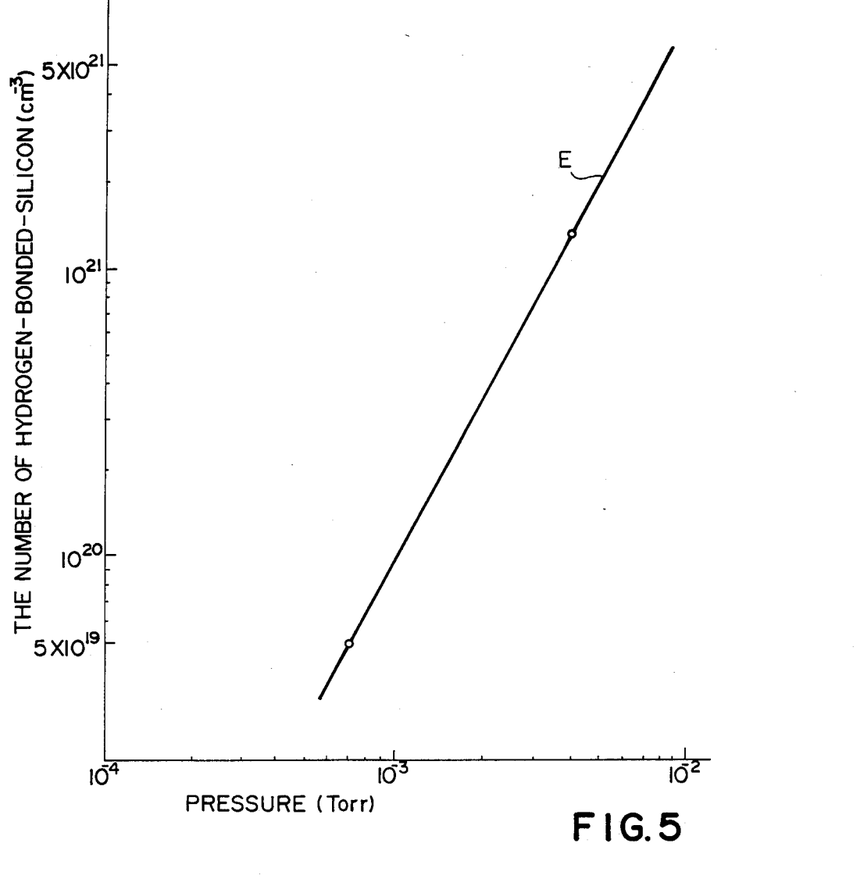
FIG. 5 is a graph showing the relationship between the number of hydrogen-bonded-silicon and the pressure in the CVD reactor.

Turning to FIG. 5 of the drawings, there is shown pressure dependency of the hydrogen-bonded-silicons contained in the passivation film 12 formed by the plasma-assisted chemical vapor deposition with the electron cyclotron resonance phenomenon. As will be understood from plots E of FIG. 5, the number of the hydrogen-bonded-silicons per $cm^3$ is varied by changing the pressure of the gaseous mixture of silane and nitrogen. If the passivation layer 12 contains the the hydrogen-bonded-silicons equal in number to or less than $5 \times 10^{21}$ per $cm^3$, it is necessary to restrict the pressure of the gaseous mixture equal to or less than about $8 \times 10^{-3}$ Torr. This is because of the fact that the ion bombardments in a low-pressure reactor cause the unstable hydrogen-bonded-silicons to effectively dissociate.

As described hereinbefore, the semiconductor device according to the present invention is advantageous in stability because of the passivation layer having the hydrogen-bonded-silicons equal in number to or less than $5 \times 10^{21}$ per $cm^3$.

Although particular embodiment of the present invention have been shown and described, it will be obvious to those skilled in the art that various changes and modifications may be made without departing from the spirit and scope of the present invention.

What is claimed is:

1. A process of fabricating a semiconductor devise, comprising the steps of:
    (a) preparing a multi-layer structure having source and drain regions formed in respective portions of a semiconductor substrate, a gate insulating film formed over an area between the source and drain regions and a gate electrode structure formed on the gate insulating film; and
    (b) forming a passivation film covering said multi-layer structure by a plasma-assisted chemical vapor deposition technique using a plasma associated with an electron cyclotron resonance, said passivation film being formed with a contained number of hydrogen-bonded-silicons less than or equal to $5 \times 10^{21}$ per cubic centimeter, thereby improving the sensitivity of the passivation film to injected hot carriers.

2. A process as set forth in claim 1, in which said plasma-assisted chemical vapor deposition is carried out by using a gaseous mixture having silane and nitrogen.

3. A process as set forth in claim 1, in which said plasma-assisted chemical vapor deposition is carried out at a pressure equal to or less than $8 \times 10^{-3}$ Torr.

* * * * *